US008187013B2

(12) United States Patent
Saito et al.

(10) Patent No.: US 8,187,013 B2
(45) Date of Patent: May 29, 2012

(54) ELECTRONIC APPARATUS (75) Inventors: Hiroyuki Saito, Kawasaki (JP); Kyoko Saito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/188,238

(22) Filed: Jul. 21, 2011

(65) Prior Publication Data
US 2012/0028481 A1  Feb. 2, 2012

(30) Foreign Application Priority Data

Jul. 28, 2010  (JP) .................................. 2010-169696

(51) Int. Cl.
*H01R 27/00* (2006.01)
(52) U.S. Cl. ........................................................ 439/218
(58) Field of Classification Search .................. 439/218, 439/77, 502, 505, 540.1; 361/749, 679.4
See application file for complete search history.

(56) References Cited

U.S. PATENT DOCUMENTS

| 3,696,319 | A | * | 10/1972 | Olsson ........................... 439/496 |
| 5,013,252 | A | * | 5/1991 | Nienhuis et al. ............... 439/215 |
| 5,096,434 | A | * | 3/1992 | Byrne ............................ 439/215 |
| 5,164,544 | A | * | 11/1992 | Snodgrass et al. ............ 174/495 |
| 5,252,086 | A | * | 10/1993 | Russell et al. ................ 439/215 |
| 6,638,111 | B1 | * | 10/2003 | McDaid et al. ........... 439/607.09 |
| 7,727,028 | B1 | * | 6/2010 | Zhang et al. .................. 439/660 |
| 7,905,737 | B2 | * | 3/2011 | Byrne ............................ 439/215 |
| 7,918,673 | B1 | * | 4/2011 | Mimura et al. ................ 439/101 |
| D639,736 | S | * | 6/2011 | Su .................................. D13/110 |
| 8,016,600 | B2 | * | 9/2011 | Li .................................... 439/39 |
| 8,050,714 | B2 | * | 11/2011 | Fadell et al. ................... 455/557 |
| 8,079,846 | B1 | * | 12/2011 | Cookson .......................... 439/13 |
| 2008/0254661 | A1 | * | 10/2008 | Byrne ............................. 439/215 |
| 2011/0201214 | A1 | * | 8/2011 | Matsubara et al. .............. 439/55 |
| 2011/0201215 | A1 | * | 8/2011 | Matsubara et al. .............. 439/55 |
| 2011/0256739 | A1 | * | 10/2011 | Nakaie et al. ................... 439/55 |

FOREIGN PATENT DOCUMENTS

JP  2007-166290 A  6/2007

* cited by examiner

*Primary Examiner* — Tulsidas C Patel
*Assistant Examiner* — Vladimir Imas
(74) *Attorney, Agent, or Firm* — Canon USA Inc IP Division (57) ABSTRACT

An electronic apparatus including a first wiring board formed having a first area, a second area, and a third area, wherein the first area is formed extending in a first direction from the third area, and the second area is formed extending in a second direction, which is opposite to the first direction, from the third area, a second wiring board connected to the first wiring board, a first connector for connection to an external device, wherein the first connector is mounted on the first area of the first wiring board, a second connector for connection to an external device, wherein the second connector is mounted on the second area of the first wiring board, and a third connector connected to the second wiring board, wherein the third connector is mounted on the third area of the first wiring board, and is formed with a first terminal array and a second terminal array facing each other, wherein on the first wiring board a first differential transmission line is formed in a region from the first connector to the first terminal array, and a second differential transmission line is formed in a region from the second connector to the second terminal array.

9 Claims, 10 Drawing Sheets

ELECTRONIC APPARATUS

BACKGROUND OF THE INVENTION

1. Field of the Invention

The present invention relates to an electronic apparatus, and in particular, to an electronic apparatus in which a plurality of differential transmission lines is mounted on one wiring board.

2. Description of the Related Art

The frequency of digital signals used in electronic apparatuses, such as a digital camera, is increasing year by year. Further, the signal transmission rate is also increasing. To enable signal transmission at a high rate, recently differential transmission, represented by low voltage differential signaling (LVDS) may be used. LVDS is an input/output signal level specification for the purpose of realizing high-speed transmission of several hundred M bit/second or higher with an amplitude reduced to several hundred mV, which is less susceptible to the effects of noise produced by performing differential transmission over impedance-controlled wiring.

Further, in electronic apparatuses such as a digital camera, an interface such as a universal serial bus (USB) or a high-definition multimedia interface (HDMI) employing differential transmission may be used to communicate with an external device. In this case, to increase the degree of freedom for mounting of a USB connector or a HDMI connector in the electronic apparatus, the interface may be mounted on a printed wiring board different to the printed wiring board that a system integrated chip (IC) is mounted on. Japanese Patent Application Laid-Open No. 2007-166290 discusses connecting a USB or HDMI signal with a printed wiring board on which the system IC is mounted via a connector for signal connection.

When a plurality of interfaces, like USB and HDMI, employing differential transmission is mounted on one printed wiring board, differential transmission lines controlled with respectively different impedances are mounted on one printed wiring board. In this case, crosstalk between the differential transmission lines has to be prevented.

SUMMARY OF THE INVENTION

According to an aspect of the present invention, an electronic apparatus includes a first wiring board formed having a first area, a second area, and a third area, wherein the first area is formed extending in a first direction from the third area, and the second area is formed extending in a second direction, which is opposite to the first direction, from the third area, a second wiring board connected to the first wiring board, a first connector for connection to an external device, wherein the first connector is mounted on the first area of the first wiring board, a second connector for connection to an external device, wherein the second connector is mounted on the second area of the first wiring board, and a third connector connected to the second wiring board, wherein the third connector is mounted on the third area of the first wiring board, and is formed with a first terminal array and a second terminal array facing each other, wherein on the first wiring board a first differential transmission line is formed in a region from the first connector to the first terminal array, and a second differential transmission line is formed in a region from the second connector to the second terminal array.

According to the present invention, crosstalk between differential transmission lines can be reduced and impedance mismatches can be prevented from occurring, even when differential transmission lines controlled with respectively different impedances are mounted on one printed wiring board.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1A:
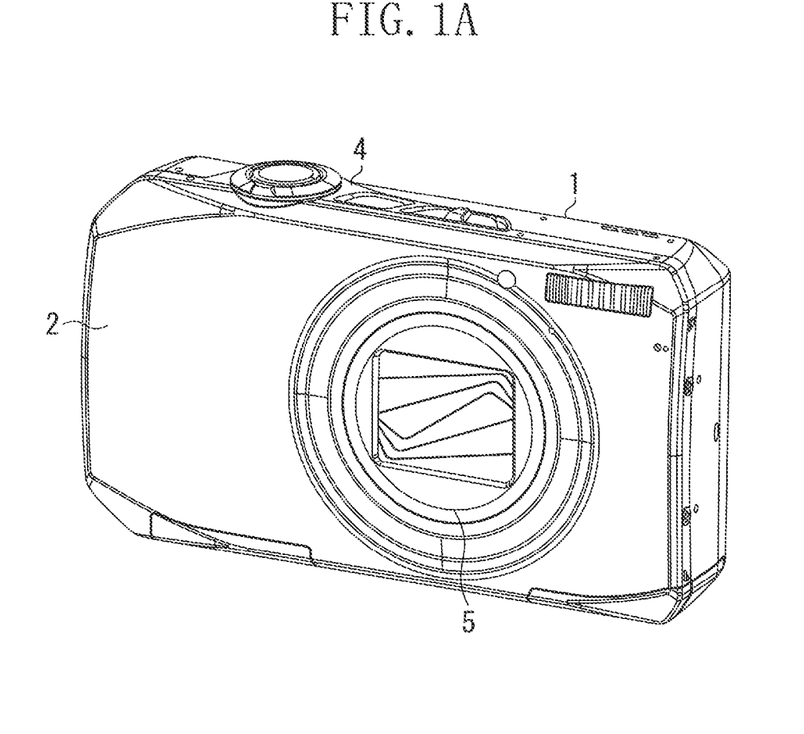
FIGS. 1A and 1B are external perspective views of a digital camera, which is an exemplary embodiment according to the present invention.
Figure 1B:
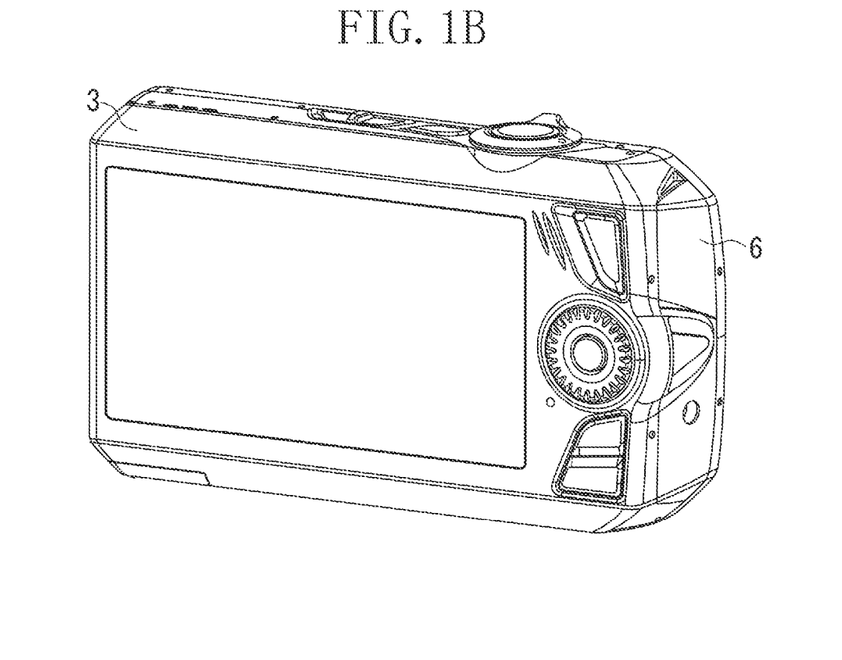

FIGS. 1A and 1B are external perspective views of a digital camera, which is an example of an electronic apparatus according to the present exemplary embodiment. The digital camera has a camera body 1, a front cover 2, a rear cover 3, a top base 4, a lens barrel unit 5, and, a jacket cover 6 is disposed on a camera body side face. The jacket cover 6 is supported with respect to the camera body 1 so that it can be opened and shut. An external interface for data communication with a below-described external apparatus is arranged on the inner side of the jacket cover 6. In the present exemplary embodiment, a USB connector and a HDMI connector are arranged as external interfaces. The digital camera can be connected with the external apparatus by plugging in the respective dedicated cable for these connectors.

Next, a printed wiring board 10 according to the present exemplary embodiment, which acts as a first wiring board on which a USB connector 11 as a first connector and a HDMI connector 12 as a second connector are mounted, will be described using FIG. 2. The printed wiring board 10 according to the present exemplary embodiment is a flexible printed wiring board that is flexible. The USB connector 11 and the HDMI connector 12 are mounted on the same flexible printed wiring board 10 (hereinafter, "jack-flex 10"). A board-to-board connector 13 which has an engagement member and acts as a third connector, is mounted on the jack-flex 10. As described below, the board-to-board connector 13 is provided to electrically connect with a printed wiring board 40, which acts as a second wiring board, on which the system IC is mounted. More specifically, the jack-flex 10, which acts as a first wiring board, can be electrically connected with the printed wiring board 40, which acts as a second wiring board, by the board-to-board connector 13, which acts as a third connector. A contact point of the board-to-board connector 13 with the jack-flex 10 has a first terminal array 14 arranged at a predetermined pitch and a second terminal array 15 arranged facing the first terminal array 14 at a predetermined pitch.

The jack-flex 10 is formed from a first area A on which the USB connector 11 is mounted, a second area B on which the HDMI connector 12 is mounted, and a third area C positioned between the first and second areas. The first area is formed extending in a first direction 16 from the third area. The second area is formed extending in a second direction 17, which is opposite to the first direction, from the third area. The board-to-board connector 13 is mounted on the third area of the jack-flex 10 so that the first terminal array 14 of the board-to-board connector 13 is on the first area side of the jack-flex 10 and the second terminal array 15 of the board-to-board connector 13 is on the second area side of the jack-flex 10.

Figure 2:
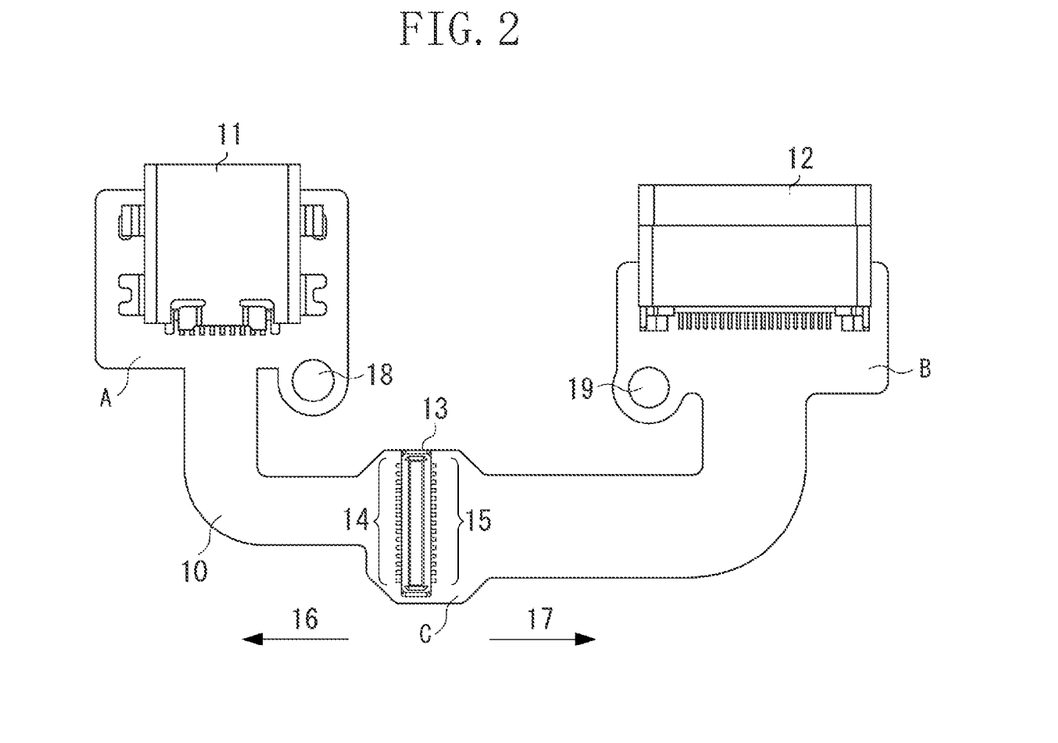
FIG. 2 is a developed view of a printed wiring board as a first wiring board.

Specifically, as illustrated in FIG. 2, the board-to-board connector 13 is mounted in such a way as to traverse the third area of the jack-flex 10. The jack-flex 10 has a shape extending in the first direction 16 from the first terminal array 14 of the board-to-board connector 13, and a shape extending in the second direction 17 from the second terminal array 15. Further, the jack-flex 10 is connected with the first area on which the USB connector 11 is mounted and the second area on which the HDMI connector 12 is mounted via corner shapes and generally having an "L" shape.

A differential transmission line 20, which is a first differential transmission line, is formed in a region from the first area on which the USB connector 11 is mounted to the first terminal array 14 of the board-to-board connector 13. Differential transmission lines 24a to 24d, which are second differential transmission lines, are formed in a region from the second area on which the HDMI connector 12 is mounted to the second terminal array 15 of the board-to-board connector 13. Therefore, the differential transmission line 20 is formed in the first direction 16 from the first terminal array 14 of the board-to-board connector 13 and differential transmission lines 24a to 24d are formed in the second direction 17 from the second terminal array 15 of the board-to-board connector 13.

Holes 18 and 19 are open to the first area on which the USB connector 11 is mounted and the second area on which the HDMI connector 12 is mounted, respectively. The jack-flex 10 can be fixed to the camera body with other parts by a screw being screwed into these holes 18 and 19 during assembly. Further, the USB connector 11, the HDMI connector 12, and the board-to-board connector 13 are mounted on the same face of the jack-flex 10. Consequently, reflow only needs to be performed once during the jack-flex mounting process, which allows costs to be reduced. In addition, less through hole wiring is required than when the USB connector 11, the HDMI connector 12, and the board-to-board connector 13 are mounted on the different face of the jack-flex 10.

Figure 3A:
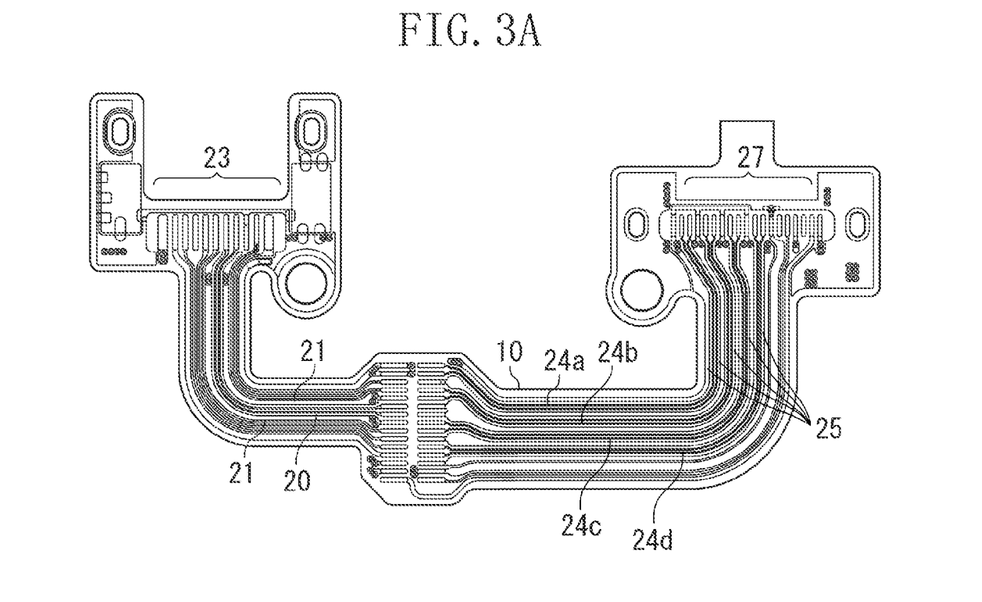
FIGS. 3A and 3B are wiring pattern diagrams of a printed wiring board as a first wiring board.
Figure 3B:
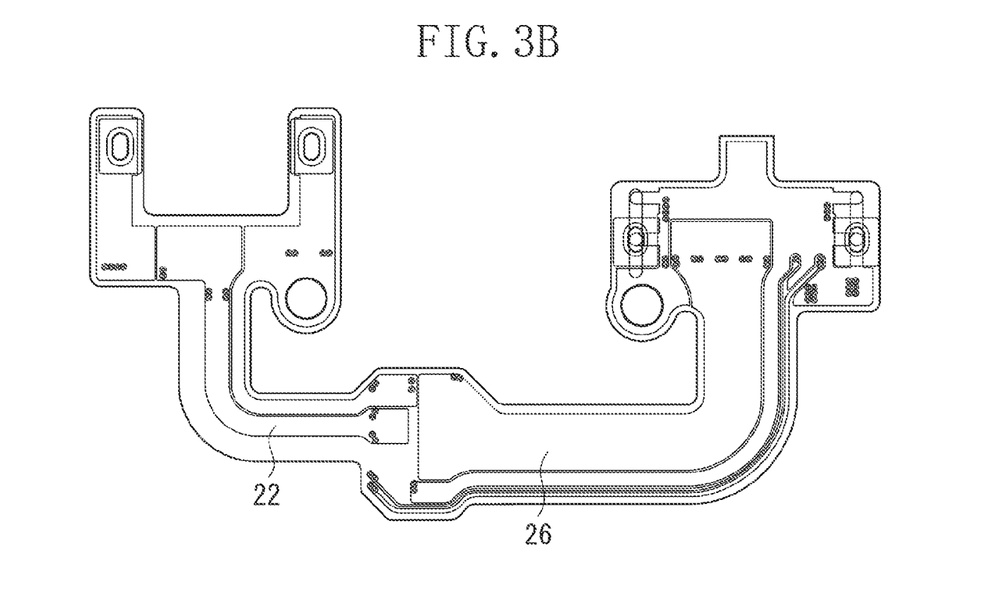

Next, a wiring pattern of the jack-flex 10 will be described using FIGS. 3A and 3B. FIG. 3A illustrates the wiring pattern on a part mounting face. FIG. 3B illustrates a wiring pattern on the side opposite to the part mounting face.

Figure 4:
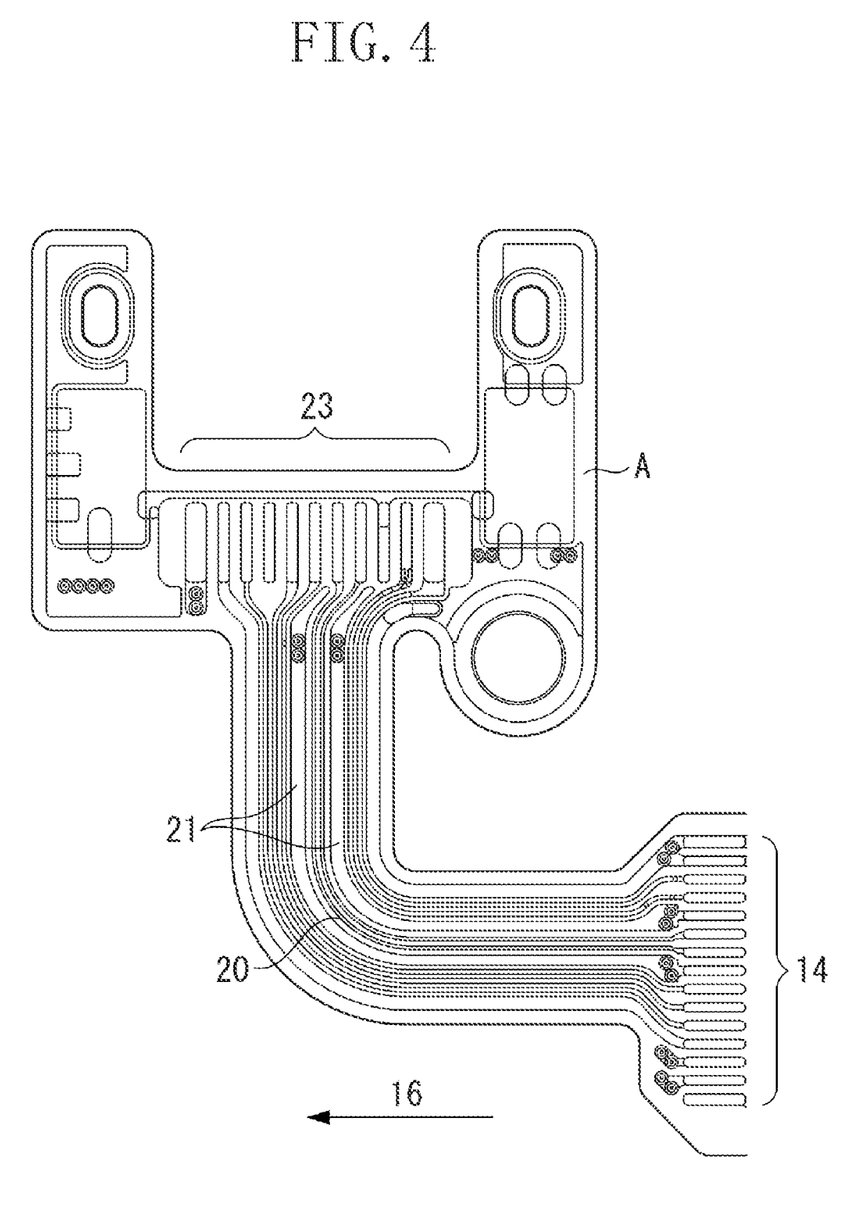
FIG. 4 is an expanded view of an area of a printed wiring board on which USB connector is mounted.

First, a USB signal wiring pattern will be described. FIG. 4 is an expanded view of a first area A on which the USB connector 11 of the jack-flex 10 is mounted. The USB signal wiring pattern has a set of differential transmission lines 20 on the part mounting face. This set of differential transmission lines 20 is guarded on both side by a ground pattern 21. The area on the rear face of the USB connector mounting face which overlaps with projected images of the differential transmission lines 20 and the ground patterns 21 is guarded by a ground pattern 22. By guarding the differential transmission lines both sides and the rear face of the pair of wirings, a defined impedance is maintained. The USB signal differential transmission lines 20 in the present exemplary embodiment are adjusted to 90Ω. The differential transmission lines wired from a USB connector terminal section 23 are connected to the first terminal array 14 of the board-to-board connector 13 without passing through a through hole. Since an impedance mismatch can occur in through holes, it is preferred not to provide a through hole on the differential transmission line path. In the present exemplary embodiment, since the USB connector 11 and the board-to-board connector 13 are mounted on the same face, the wiring can be achieved without providing a through hole for the USB signal differential transmission lines.

Figure 5:
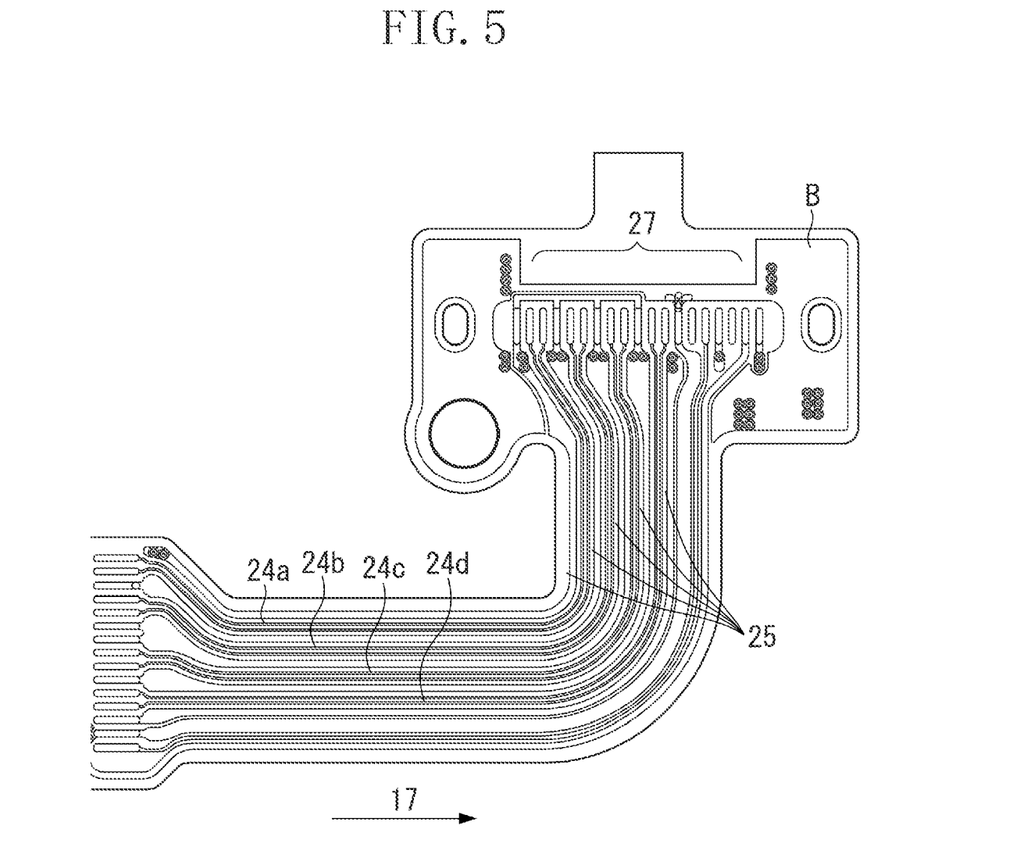
FIG. 5 is an expanded view of an area of a printed wiring board on which HDMI connector is mounted.

Next, a HDMI signal wiring pattern will be described. FIG. 5 is an expanded view of a second area B on which the HDMI connector 12 of the jack-flex 10 is mounted. The HDMI signal wiring pattern has four sets of differential transmission lines 24a to 24d on the part mounting face. These sets of differential transmission lines 24a to 24d are guarded on either side by a ground pattern 25. The area on the rear face of the HDMI connector mounting face which overlaps with projected images of the differential transmission lines 24a to 24d and the ground patterns 25 is guarded by a ground pattern 26. The HDMI signal differential transmission lines in the present exemplary embodiment are adjusted to 100Ω. The HDMI connector 12 and the board-to-board connector 13 are mounted on the same face, so that the differential transmission lines wired from a HDMI connector terminal section 27 are connected to the second terminal array 15 of the board-to-board connector 13 without passing through a through hole.

The jack-flex 10 in the present exemplary embodiment has a roughly L shaped corner between the HDMI connector terminal 27 and the second terminal array 15 of the board-to-board connector. In the present exemplary embodiment, by making the board appearance generally "L" shaped, during the below-described attachment with the body, the USB connector 11 and the HDMI connector 12 can be arranged at adjacent positions. If a differential transmission line is wired to a generally "L" shaped corner portion, there may be a large difference in wiring length between the differential transmission line 24a wired on the inner side of the corner shape and the differential transmission line 24d wired on the outer side of the corner shape. It is preferred that each pair of differential transmission lines has an equal wiring length. Thus, in the present exemplary embodiment, if the differential transmission line 24d wired on the outermost side of the corner is connected to the HDMI connector terminal portion 27 and the second terminal array 15 of the board-to-board connector, the differential transmission line 24d is wired so as to have the shortest path. The jack-flex 10 in the present exemplary embodiment is likely to be used by bending it during attachment to the camera body. Consequently, it is preferred that the external width of the flex is as small as possible. Therefore, the wiring pitch of the differential transmission lines 24a to 24d is set smaller than the terminal pitch of the HDMI connector 12 and the terminal pitch of the board-to-board connector 13. Consequently, if the differential transmission line 24d formed on the outermost side of the corner shape is wired with the shortest path as in the present exemplary embodiment, regarding the other differential transmission lines, the closer a differential transmission line is to the inner side of the corner shape, the more detours the differential transmission line is made to have. Thus, by wiring the differential transmission lines so that the closer a differential transmission line is to the inner side of the corner shape the more detours it has, an improvement can be made to the problem of each differential transmission line having a different wiring length for a generally "L" shaped corner.

Generally, when using a board-to-board connector, the wiring for the terminal on the far side of the connector with respect to the wiring direction is often made to detour to avoid a near side terminal, or is wired on the rear face of the connector and a through hole is provided near the far side terminal. When wiring differential transmission lines on such a printed wiring board, a differential transmission line is wired to the terminal on the near side of the board-to-board connector, and the remaining signal lines are wired to the terminal on the far side. However, if there is a plurality of types of differential transmission line as in the present exemplary embodiment, the differential transmission lines and the ground patterns may not all fit within the terminal array on one side of the board-to-board connector. In such a case, it is necessary to either make the differential transmission lines detour on the same connector face or to wire to the rear side of the terminal array and then wire to the terminal on the far side via a through hole. As described above, it is preferred not to pass the differential transmission lines through a through hole, since an impedance mismatch can occur due to interference with the patterns on the connector terminal portion if the differential transmission lines are wired to the rear face of the connector terminal portion. In the present exemplary embodiment, for the two types of differential transmission line, a USB signal differential transmission line 21 is wired in the first direction 16 from the first terminal array 14 of the board-to-board connector 13 and a HDMI signal differential transmission line 24 is wired in the second direction 17 from the second terminal array 15. Consequently, signal interference and impedance mismatch can be prevented in the board-to-board connector terminal array even when a plurality of differential transmission lines is formed on the same board. Further, by folding the thus-configured jack-flex 10 and arranging it on the camera body 1, the USB connector 11 and the HDMI connector 12 can be arranged on the same face.

Figure 6:
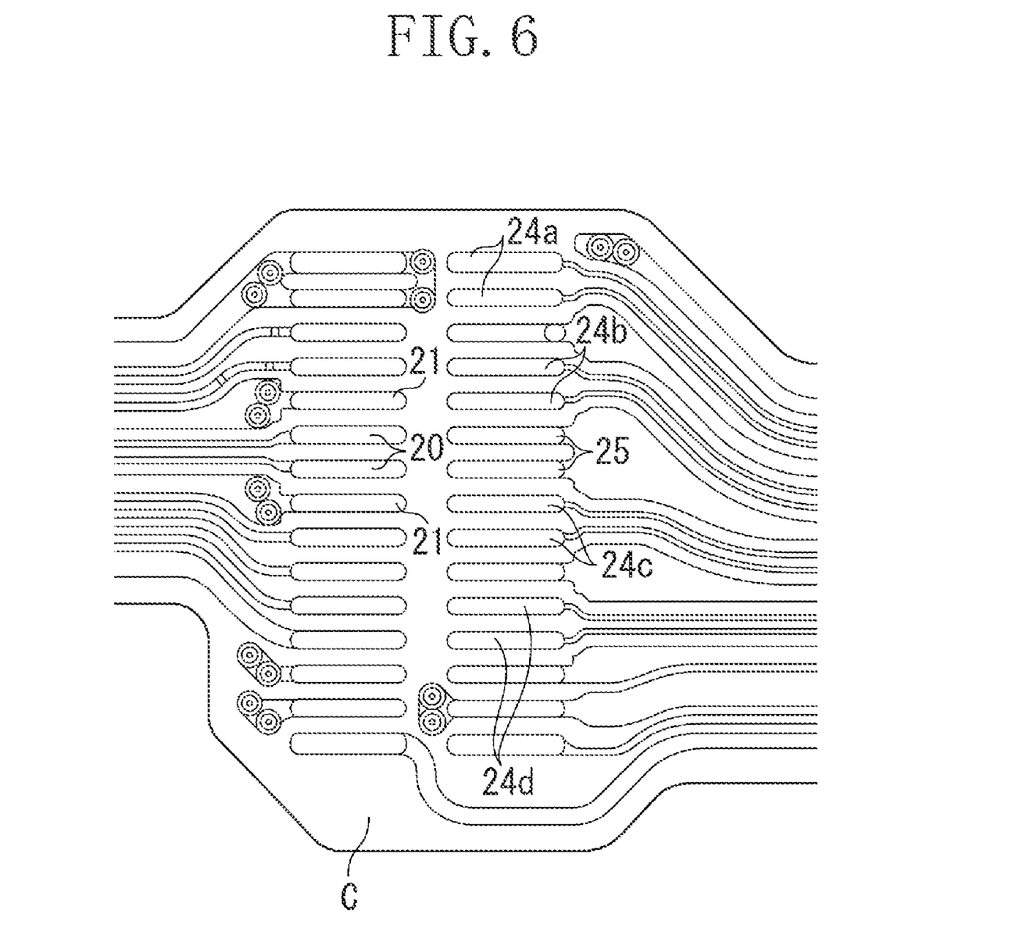
FIG. 6 is an expanded view of a portion in a printed wiring board on which a board-to-board connector is mounted.

Next, the arrangement pattern of the section on which the board-to-board connector 13 is mounted will be described. FIG. 6 is an expanded view of a third area C on which the board-to-board connector 13 illustrated in FIG. 3A is mounted. As illustrated in FIG. 6, in the board-to-board connector 13, among the first terminal array 14, the terminal that the differential transmission line 20 is connected to, and among the second terminal array 15, the terminals that the differential transmission lines 24a to 24d are connected to, are arranged so as not to face each other. Specifically, among the first terminal array 14, the terminal that the differential transmission line 20 is connected to, and among the second terminal array 15, the terminal that the ground pattern 25 is connected to, are wired so as to face each other. Depending on the board-to-board connector, there may be little clearance between the first terminal array 14 and the second terminal array 15. Even in such a case, by making the terminal in the second terminal array 15 facing the terminal of the first terminal array 14 that the differential transmission line is connected to be a ground pattern or a different signal line from the differential transmission line, interference among the differential signals can be prevented, and thus stable transmission can be achieved.

Figure 7A:
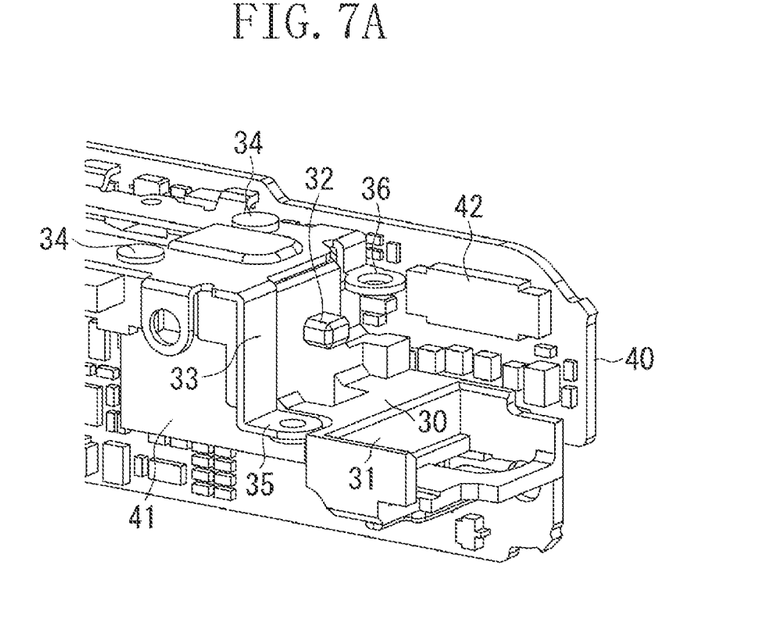
FIGS. 7A to 7D illustrate a procedure for attaching a printed wiring board to a camera body.

Next, the procedure for attaching the jack-flex 10 to the camera body 1 will be described. In FIG. 7A, a base 30 to be arranged on a camera body upper face has a box shaped portion 31 formed matching the external form of the HDMI connector 12 so as to support the external form of the HDMI connector. On the base upper face, a chassis 33 formed from a metal member is fixed to the base 30 by a heat stake 34.

The base 30 has a convexity 32, which is used for positioning during the below-described members assembly. In an assembled state, a screw seat 35 and a hole 36 are respectively arranged on the chassis 33 at portions corresponding to the holes 18 and 19 of the jack-flex 10. The printed wiring board 40 (hereinafter, "main board 41") on which a system IC 41 is mounted is arranged on a side face of the base 30. Further, a board-to-board connector 42 that engages with the board-to-board connector 13 of the jack-flex 10 is mounted on the side face of the base 30.

Figure 7B:
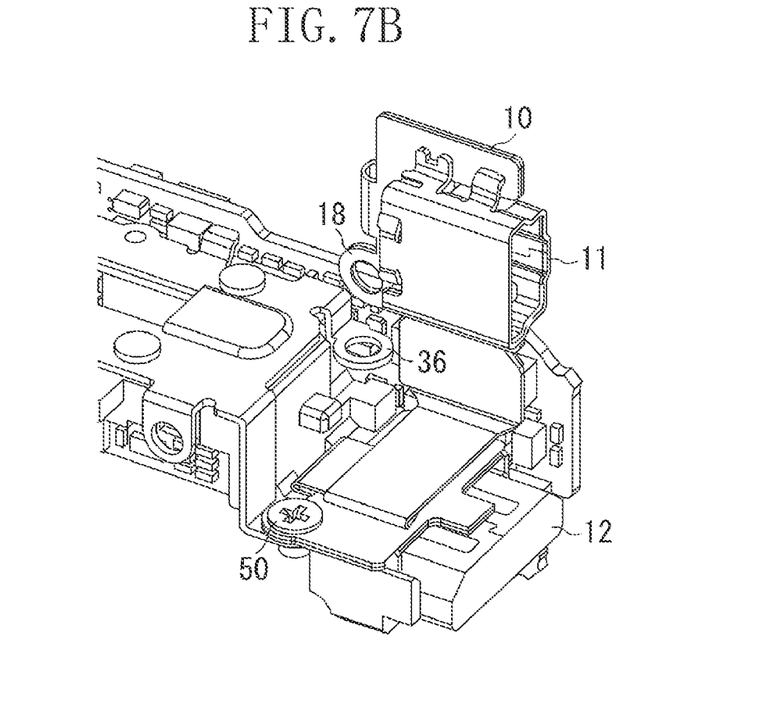

Next, with the base 30 and the chassis 33 in a fixed state, the jack-flex 10 is attached to the box shaped portion 31 of the base with the mounting face of the HDMI connector 12 facing downwards (refer to FIG. 7B). The jack-flex 10 is fixed to the chassis 33 with a screw 50, and then the board-to-board connector of the jack-flex 10 and the board-to-board connector of the main board 40 are engaged with each other to connect the jack-flex and the main board. A shell ground pattern of the HDMI connector 12 is exposed at a portion abutting on the chassis 33 near the hole 19 of the jack-flex. By fixing with a screw 50, the ground pattern of the jack-flex 10 and the chassis 33 can be electrically connected. Electrically connecting the shell ground of the HDMI connector 12 with the chassis 33 strengthens the HDMI connector shell ground, so that unnecessary emissions and malfunctions caused by static electricity can be prevented.

Figure 7C:
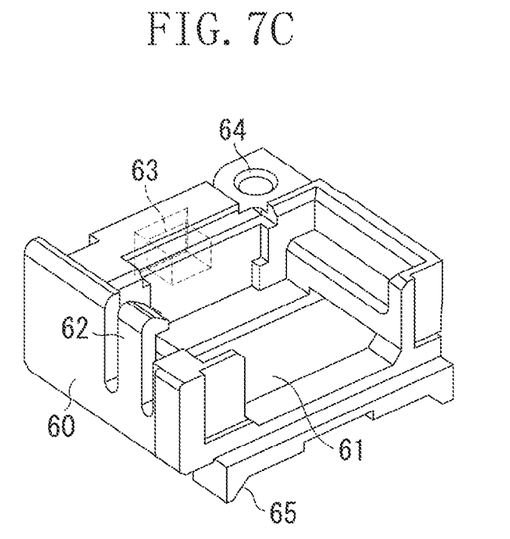

Next, with the jack-flex 10 and the main board 40 in a connected state, the USB holder 60 illustrated in FIG. 7C is attached. The USB holder 60 has a box shaped portion 61 that matches the external form of the USB connector 11 so as to support the external form of the USB connector 11. The USB holder has a latch member 62, which prevents the flex on the USB connector mounting section from lifting up when attaching the jack-flex 10. The USB holder 60 also has a concavity 63 corresponding to the convexity 32 provided on the base 30. A screw seat 64 positioned corresponding to the hole 36 of the chassis is also arranged on the USB holder 60. The USB holder 60 has a receiving portion 65 that matches the external form of the HDMI connector on the side opposite to the box shaped portion 61.

Figure 7D:
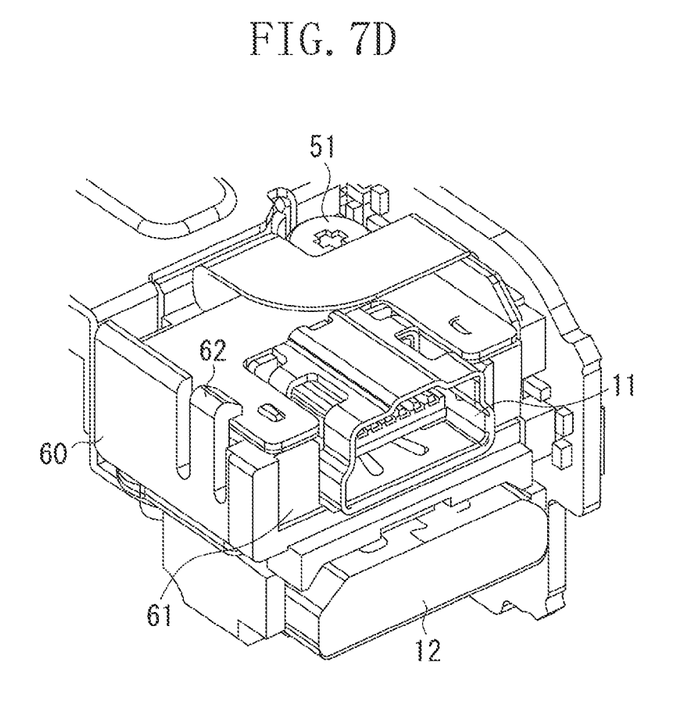

The chassis 33 and the jack-flex 10 are fixed to the screw seat 64 provided on the USB holder 60 by a screw 51 (see FIG. 7D). A shell ground pattern of the USB connector 11 is exposed at a section abutting on the chassis 33 near the hole 18 of the jack-flex 10. By fixing with the screw 51, the ground pattern of the jack-flex 10 and the chassis 33 can be electrically connected. Electrically connecting the shell ground of the USB connector 11 with the chassis strengthens the USB connector shell ground, so that unnecessary emissions and malfunctions caused by static electricity can be prevented.

In the present exemplary embodiment, the base has a shape that matches the external form of the HDMI connector, and the USB holder has a shape that matches the USB connector and the HDMI connector. When the camera is used with a USB cable or a HDMI cable inserted into the respective connector, if the connector is not fixed a load is placed on the signal terminal portion, which may cause the solder to detach. Therefore, when the camera body is assembled as described above, by fixing with a part that matches the external form of the connector, the soldered portions of the respective connector can be prevented from detaching when the USB cable or the HDMI cable is inserted. Further, by arranging the external interface connector at an adjacent position as in the present exemplary embodiment, when taking measures against static pressure, such as solder detachment prevention, the measures can be performed with just a few parts.

By attaching the jack-flex to the camera body in the above manner, the USB connector and the HDMI connector can be arranged at adjacent positions in a flexible shape which suppresses signal interference. By arranging the USB connector and the HDMI connector at adjacent positions, prevention of unnecessary emissions, measures against static electricity, and measures against static pressure can be handled using common parts for each signal. In addition, by arranging the external interfaces at the same portion on the camera body, a cover member for protecting the terminals when the external interfaces are not being used can be configured in an integrated manner, allowing the number of parts to be reduced.

Figure 8A:
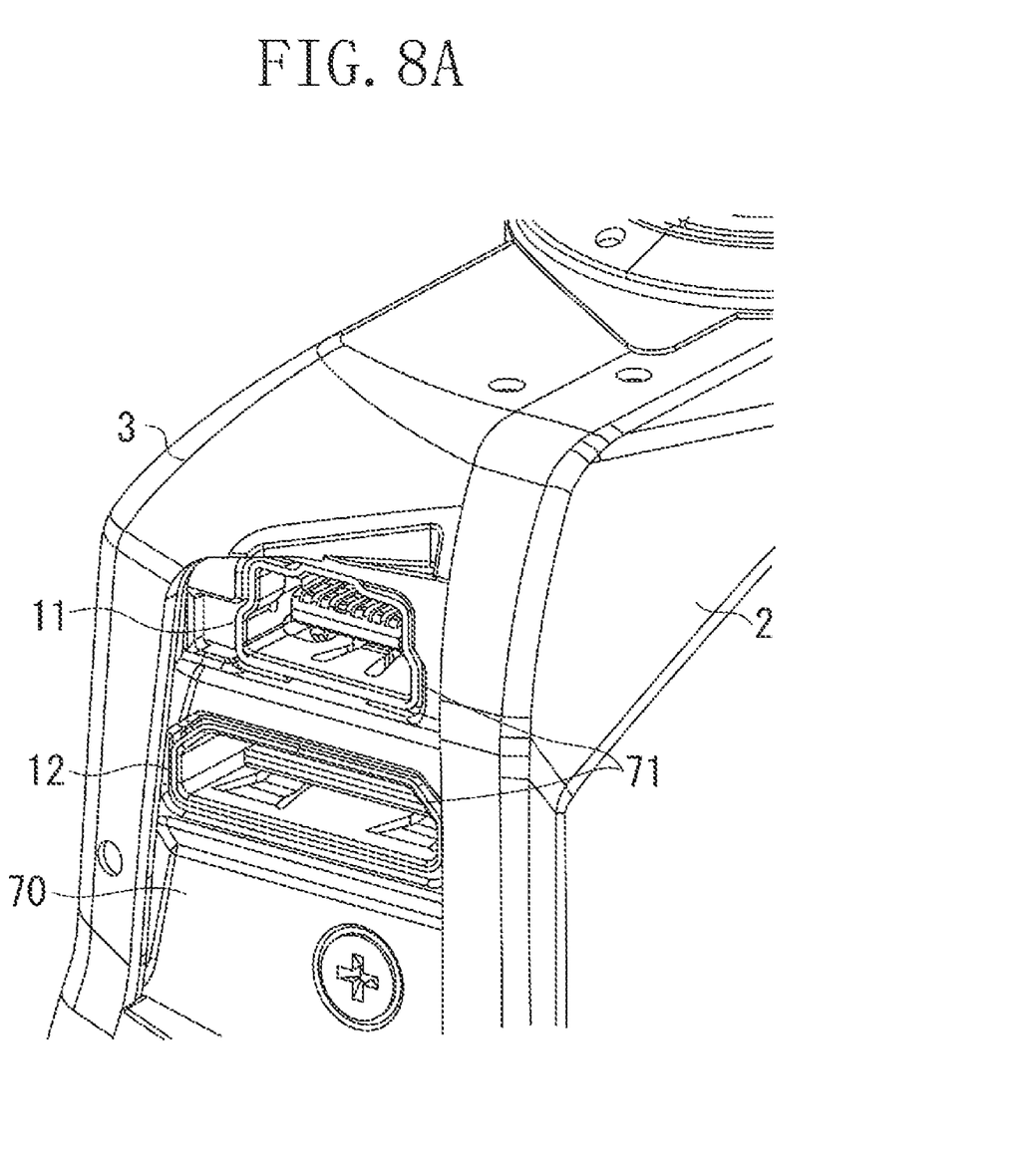
FIGS. 8A to 8C are perspective views illustrating when an external interface is used.
Figure 8B:
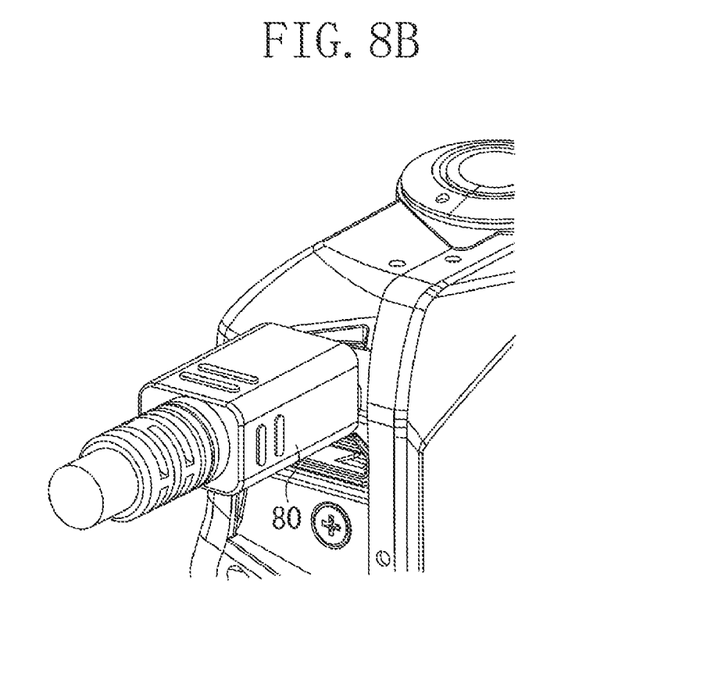
Figure 8C:
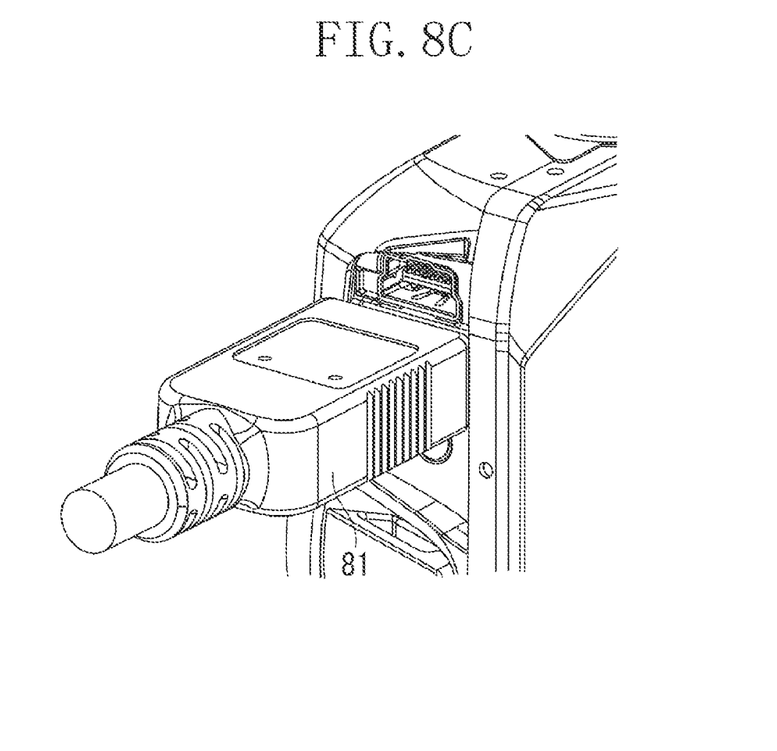

Next, a state when the external interfaces are in use will be described using FIGS. 8A to 8C. As described above, the USB connector 11 and the HDMI connector 12 that have been attached to the camera body are arranged on a side face of the camera body. FIG. 8A illustrates a state when the jacket cover 6 has been removed from the camera body. When the jacket cover is removed, the tips of the USB connector 11 and the HDMI connector 12 are exposed from a jack base 70, which has an opening portion 71 that matches the external form of the respective connectors. By inserting a USB cable 80 corresponding to the USB connector 11 into the USB connector 11, data communication can be performed with an external device (see FIG. 8B). Similarly, by inserting a HDMI cable 81 corresponding to the HDMI connector 12 into the HDMI connector 12, data communication can be performed with an external device (see FIG. 8C).

According to the configuration of the above exemplary embodiment, an electronic apparatus can be provided that can prevent the occurrence of impedance mismatch and that reduces the occurrence of noise, without increasing the number of connector signals even for a printed wiring board having a plurality of differential transmission lines.

Although a preferred exemplary embodiment of the present invention was described above, the present invention is not limited to this. Various modifications and changes can be made within the gist of the invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-169696 filed Jul. 28, 2010, which is hereby incorporated by reference herein in its entirety.

What is claimed is:

1. An electronic apparatus comprising:
a first wiring board formed having a first area, a second area, and a third area, wherein the first area is formed extending in a first direction from the third area, and the second area is formed extending in a second direction, which is opposite to the first direction, from the third area;
a second wiring board connected to the first wiring board;
a first connector for connection to an external device, wherein the first connector is mounted on the first area of the first wiring board;
a second connector for connection to an external device, wherein the second connector is mounted on the second area of the first wiring board; and
a third connector connected to the second wiring board, wherein the third connector is mounted on the third area of the first wiring board, and is formed with a first terminal array and a second terminal array facing each other, wherein
on the first wiring board, a first differential transmission line is formed in a region from the first connector to the first terminal array, and a second differential transmission line is formed in a region from the second connector to the second terminal array.

2. The electronic apparatus according to claim 1, wherein the first and the second differential transmission lines are formed so that, among the first terminal array, the terminal that the first differential transmission line is connected to, and among the second terminal array, the terminal that the second differential transmission line is connected to, are arranged so as not to face each other.

3. The electronic apparatus according to claim 2, wherein the first and the second differential transmission lines are formed so that, among the first terminal array, the terminal that the first differential transmission line is connected to, and among the second terminal array, the terminal that is connected to a ground, are arranged so as to face each other.

4. The electronic apparatus according to claim 1, wherein the third area has a corner shape, the first and the second differential transmission lines are wired so that the closer the differential transmission line is to the inner side of the corner shape, the more detours it has.

5. The electronic apparatus according to claim 1, wherein the first differential transmission line and the second differential transmission line are adjusted to have different impedances from each other.

6. The electronic apparatus according to claim 1, wherein the first connector is a USB connector, the second connector is a HDMI connector, and the third connector is a board-to-board connector.

7. The electronic apparatus according to claim 3, wherein the first differential transmission line is guarded on either side by a ground pattern and the second differential transmission line is guarded on both sides by a ground pattern.

8. The electronic apparatus according to claim 7, wherein the first wiring board has a rear face, and wherein a projected image of the first differential transmission line on the rear face is guarded by a ground pattern and a projected image of the second differential transmission line on the rear face is guarded by a ground pattern.

9. The electronic apparatus according to claim 1, wherein the second differential transmission line is a plurality of second differential transmission lines, each second differential transmission line having approximately the same wiring length.

* * * * *